United States Patent [19]

Dorsey

[11] Patent Number: 4,701,725

[45] Date of Patent: Oct. 20, 1987

[54] RADIO FREQUENCY SIGNAL COUPLER

[75] Inventor: Denis P. Dorsey, Levittown, Pa.

[73] Assignee: RCA Corporation, Princeton, N.J.

[21] Appl. No.: 869,176

[22] Filed: May 30, 1986

[51] Int. Cl.[4] ........................ H03H 7/01; H03H 5/12; H02H 3/22

[52] U.S. Cl. ........................ 333/185; 333/12; 333/176; 333/184; 361/117; 361/119

[58] Field of Search ........................ 333/167, 175–177, 333/202, 204, 205, 219, 12, 17 L, 245, 246, 181–185, 24 R; 361/117, 118, 107, 119

[56] References Cited

U.S. PATENT DOCUMENTS

| | | | |
|---|---|---|---|
| 884,108 | 4/1908 | Stone | 333/177 X |
| 2,751,588 | 6/1956 | Grieg et al. | 333/204 |
| 3,292,049 | 12/1966 | Lucas, Jr. | 361/117 |
| 3,864,824 | 2/1975 | Watson et al. | 333/185 X |
| 3,947,934 | 4/1976 | Olson | 333/184 X |
| 4,453,145 | 6/1984 | Schuster | 333/175 X |

FOREIGN PATENT DOCUMENTS

| | | | |
|---|---|---|---|
| 0021745 | 2/1977 | Japan | 333/204 |
| 0145706 | 8/1985 | Japan | 333/205 |

*Primary Examiner*—Marvin L. Nussbaum
*Attorney, Agent, or Firm*—Paul J. Rasmussen; Peter M. Emanuel; Thomas F. Lenihan

[57] ABSTRACT

A radio frequency signal coupler includes first and second conductors formed on an insulating body for coupling signals between respective input and output couplings. A series resonant circuit is formed on the insulating body between the first and second conductors for shunt attenuating interfering signals. The series resonant circuit includes a capacitance part that also functions as a protective spark gap.

4 Claims, 5 Drawing Figures

RADIO FREQUENCY SIGNAL COUPLER

The present invention relates to the field of apparatus for coupling radio frequency (RF) signals between a source, such as an antenna, and an RF signal processing circuit, such as a tuner in a television (TV) receiver.

The TV RF signals derived from, for example, a TV antenna, a video cassette recorder, or a cable distribution system are generally coupled to a TV receiver by way of a transmission line. Typically, a twin lead transmission line is employed, its wire ends being fitted with spade lugs, for example, made to fit the clamping screw RF input terminals generally provided on the back panel of the receiver. Normally, the tuner portion of the receiver is enclosed within a shielded unit located in the receiver cabinet at a short distance from the back panel and the RF input signal is coupled from the receiver input terminals to the tuner unit by a pair of conductors.

With this arrangement, an interfering signal that may be present at the receiver input terminals together with a desired signal will be coupled to the tuner unit along with the desired signal. Interfering signals which occur outside the normal tuning frequency range of the receiver may nevertheless be sufficiently strong to cause undesirable interference with desired signals within the tuning range. For example, interfering signals from non-television sources commonly occur at frequencies above the ultra high frequency (UHF) television broadcast band and such signals are known to interfere with UHF TV signals. In order to attenuate such interfering signals, the tuner unit may incorporate one or more wave-traps, which are used despite the added cost they entail. Such a wave-trap may typically comprise a series resonant circuit tuned to the frequency of an expected interfering signal, so as to shunt it to ground through a low impedance. However, when such a wave-trap is incorporated within the tuner unit, circulating currents at the interfering signal frequency will flow inside the tuner unit and these currents will tend to get back into the signal path, thus reducing the effectiveness of the wave-trap. It is herein recognized that it is preferrable to place the wave-trap outside the tuner unit, i.e. between the input terminals and the tuner unit, so as to keep circulating currents at interfering frequencies outside the tuner unit. However, it has been common practice to incorporate wave-trap components within the tuner unit in order to avoid the added expense of separately housing and mounting such components externally to the tuner unit.

It is also desirable to provide input protection for a receiver against high voltages on the RF input terminals, such as may result from electrostatic charge on an antenna coupled to the receiver. Protection can be provided by a spark gap coupled between the RF input terminals, although this generally entails additional cost.

In accordance with a first aspect of the invention, a signal coupler comprises an electrically insulating body portion. First and second input couplings and first and second output couplings are formed on the body portion. A first conductor formed on the body portion is coupled between the first input coupling and the first output coupling, and a second conductor formed on the body portion is coupled between the second input coupling and the second output coupling. A resonant circuit arrangement formed on the body portion is coupled between the first and second conductors for providing a series resonant circuit between the first and second conductors.

In accordance with a second aspect of the invention, the resonant circuit arrangement includes an inductance formed on the body portion for providing series inductance and a capacitance formed on the body portion for providing series capacitance.

In accordance with a third aspect of the invention, the resonant circuit arrangement includes a third conductor having a meander portion for forming the inductance.

In accordance with a fourth aspect of the invention, the third conductor includes a gap portion for forming the capacitance.

In accordance with a fifth aspect of the invention, the first, second, and third conductors are formed as substantially flat strips on the body portion.

These and other aspects of the invention will be explained with reference to the accompanying Drawing in which.

Figure 1:
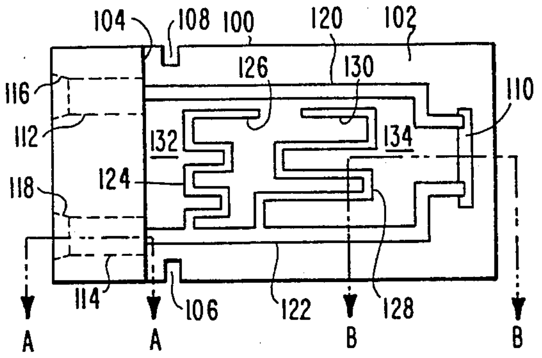
FIG. 1 shows a plan view of a signal coupler including an embodiment of the present invention.
Figure 2:
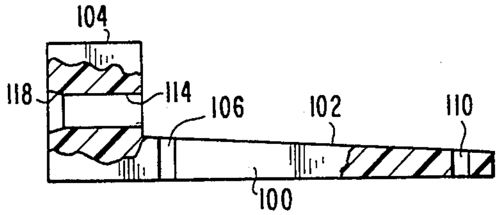
FIG. 2 shows a side elevation view of the signal coupler shown in FIG. 1, including partial section views along section lines A—B and B—B, respectively.

In the signal coupler of FIGS. 1 and 2, 100 is an insulating body having a generally rectangular flat portion 102 and an end portion 104 extending approximately at a right angle from the surface of pbrtion 102. Mounting slots, 106 and 108, are provided on each side of portion 102 and a connection slot 110 is provided adjacent the end of portion 102 which is remote from end portion 104. Two terminal holes, 112 and 114, having respective counter-sunk ends 116 and 118 are provided through end portion 104. Counter-sunk ends 116 and 118 facilitate the insertion of terminal screws by acting as guides. The inside surfaces of holes 112 and 114 are metal-plated so as to be electrically conductive. A first conductor 120 is formed by plating on portion 102. One end of conductor 120 is joined to the plating inside hole 112 and its other end extends into slot 110. A second conductor 122, running approximately parallel to conductor 120, is also formed by plating on portion 102. One end of conductor 122 is joined to the plating inside hole 114 and its other end extends into slot 110. A third conductor 124 having a meander path configuration is formed on portion 102 by plating. One end of conductor 124 joins conductor 122. A portion 126 of conductor 124, adjacent its other end, is formed so as to run in parallel proximity to the edge of conductor 120, but without contacting it. A fourth conductor 128, also having a meander path configuration, is formed so as to join conductor 122 at one end and to have a portion 130 adjacent its other end running in parallel proximity to the edge of conductor 120, but without contacting it. Insulating body 100 may be made of plastic or other suitable material.

Signal coupler 100 may, for example, be mounted on a tuner unit (not shown in FIGS. 1 and 3) in a television receiver by means of fasteners (not shown) passing through slots 106 and 108. Tuner input leads can be soldered to the ends of conductors 120 and 122 in slot 110. Holes 112 and 114 are arranged to be accessible through an opening in the receiver back panel. Signal leads are then clamped by e.g. self-tapping terminal screws driven into holes 112 and 114.

Figure 3:
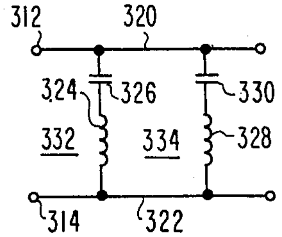
FIG. 3 shows in schematic form an equivalent circuit for the signal coupler shown in FIG. 1.

In operation, conductors 120 and 122 couple signals from the input at plated terminal holes 112 and 114 to connections made in slot 110 to the tuner. The meander path of conductor 124 constitutes an inductance and portion 126 forms one plate of a capacitance of which the other plate is provided by the adjacent portion of conductor 120. The inductance and capacitance are in series, thus forming a series resonant circuit 132 which exhibits a low impedance at resonance and a relatively high impedance off resonance. A rejection filter is thus formed with series resonant circuit 132 being the shunt element and the impedance of the signal source being the series element. The resonant frequency of resonant circuit 132 is selected to coincide with the frequency of an interfering signal, which is thereby attenuated without significantly affecting signals of other frequencies. Similarly, the meander inductance of conductor 128 and the capacitance between conductor portion 130 and conductor 120 form a series tuned circuit 134 whose resonant frequency is selected to coincide with the frequency of another interfering signal. FIG. 3 shows an equivalent circuit comprising two series resonant circuits 332 and 334, coupled in shunt between signal conductors 320 and 322. Corresponding parts in FIGS. 1 and 3 are designated by reference numerals having the same last two digits.

In this manner, interfering signals are attenuated before they reach e.g. the tuner in a TV receiver, thus avoiding the possibility of circulating currents within the tuner from reentering the signal path. All of the conductors shown in FIG. 1 are plated onto body portion 100 at the same time. Accordingly, resonant circuits 132 and 134 are formed at practically no additional cost over that of providing conductors 120 and 122 and plated holes 112 and 114. Furthermore, the gaps between conductor portions 126 and 130 and conductor 120 form spark gaps which provides protection against high voltages at the input terminals, such as may result from an electrostatic charge on an antenna, e.g. resulting from atmospheric electricity or otherwise. The spark gaps are likewise formed at practically no additional cost.

Figure 4:
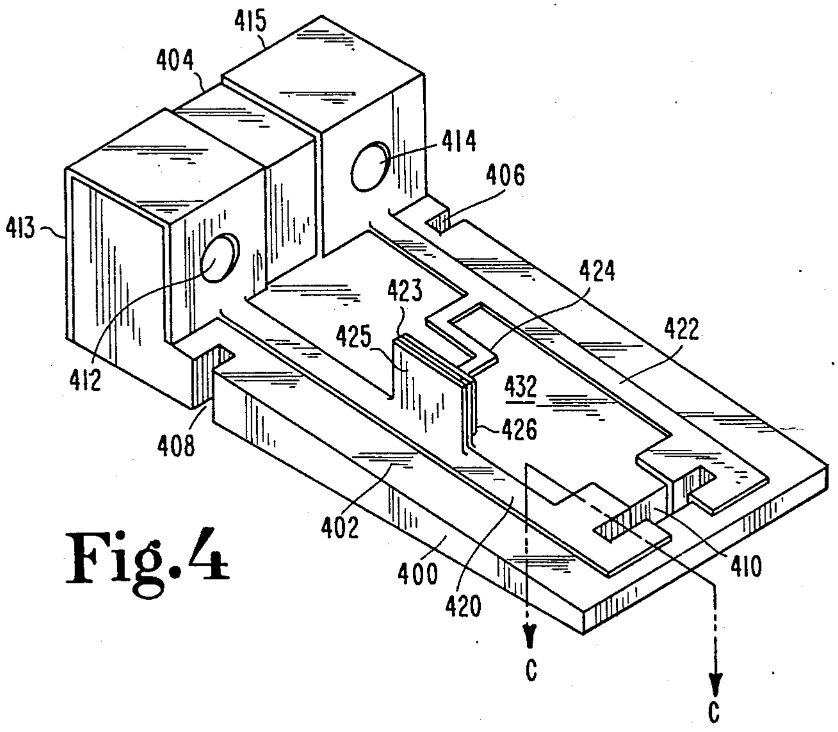
FIG. 4 shows an isometric view of a signal coupler including a further embodiment of the present invention.

FIG. 4 shows another embodiment of the present invention. Corresponding parts in FIGS. 1 and 4 are designated by numerals having the same last two digits. In the signal coupler shown in FIG. 4, the inductive portion of the series resonant circuit is formed in the same way as in the signal coupler shown in FIG. 1, i.e. by a conductor 424 having a meander path configuration. However, the capacitance portion of the series resonant circuit is different in the FIG. 4 embodiment. A relatively flat insulating tab 423 extends from surface 402 in a substantially perpendicular plane to surface 402. A conductor 425 is formed on one face of tab 423 and joins conductor 420. A further conductor 426 is formed on the other face of tab 423 and joins conductor 424, such that conductor 426 is coupled to conductor 422 by way of the meander path of conductor 424. Thus, a capacitor is formed of which conductors 425 and 426 are the plates and tab 423 defines the gap between the plates and forms the dielectric between them. The capacitance of this capacitor forms a series resonant circuit with the inductance of conductor 424 for attenuating interfering signals in the manner previously described. The gap between conductors 425 and 426 also performs as a protective spark gap which is thereby formed at practically no additional cost. Clearly, additional series resonant circuits for attenuating other interfering signals may be coupled between conductors 420 and 422 even though only one has been shown in FIG. 4 by way of illustration.

In the signal coupler shown in FIG. 1, holes 112 and 114 were illustratively described as being plated on their inside surfaces so as to provide a connection between conductors 120 and 122 and respective terminal screws. In the signal coupler shown in FIG. 4, the insides of holes 412 and 414 are not plated. Instead, connections are provided by conductors 413 and 415 which respectivley join conductors 420 and 422 and are formed over the top of end portion 404 and are brought down around the screw side of holes 412 and 414 respectively. In some instances this may be more economical in production than plating through holes.

Figure 5:
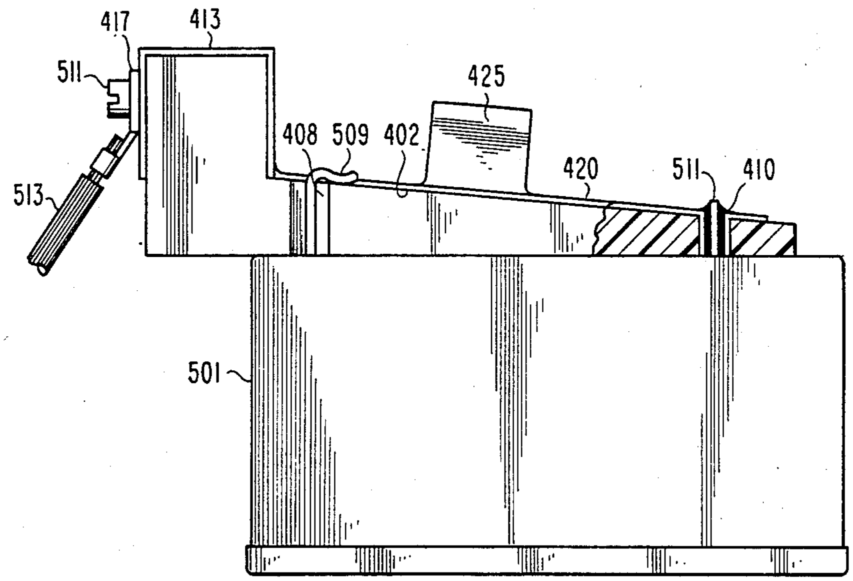
FIG. 5 shows a side elevation of the signal coupler of FIG. 4 mounted on a tuner unit including a partial section view along section line C—C.

FIG. 5 shows the signal coupler of FIG. 4 mounted on a tuner unit 501. The tuner unit 501 has a protruding tab 509 which passes through slot 408 and is shaped to maintain pressure against surface 402 so as to hold the signal coupler in place on tuner 501. Input terminal pins for the tuner extend from tuner unit 501 into slot 410 and are soldered to conductors 420 and 422 respectively, as illustrated by pin 511 in FIG. 5. A signal lead 513 comprises a signal conductor terminated in a spade lug 417 which is clamped against conductor 413 by a terminal screw 511 driven into terminal hole 412.

Clearly, the implementation of the invention as described is illustrative. Modifications for implementing the invention in accordance with the foregoing description will suggest themselves to one skilled in the art. For example, the capacitor formed on tab 423 could be located at an intermediate position along conductor 424 rather than at one end of it as illustrated. Furthermore, the capacitance portion of the signal coupler shown in FIG. 1 could utilize interdigitated electrodes for increasing the capacitance. These and other modifications are contemplated to be within the scope of the present invention which is defined by the claims following.

What is claimed is:

1. Apparatus for coupling a source of a radio frequency (RF) signal to an RF signal processing circuit, comprising:

an electrically insulating body portion;

first and second input coupling means formed on said body portion for coupling to said source;

first and second output coupling means formed on said body portion for coupling to said RF signal processing circuit;

a first conductor formed on said body portion and coupled between said first input coupling means and said first output coupling means;

a second conductor formed on said body portion and coupled between said second input coupling means and said second output coupling means;

resonant circuit means formed on said body portion and coupled between said first and second conductors for providing a series resonant circuit therebetween;

said resonant circuit means including inductance means formed on said body portion for providing series inductance and capacitance means formed on said body portion for providing series capacitance;

said resonant circuit means including a third conductor having a meander portion for forming said inductance means and a gap portion for forming said capacitance means; wherein said first, second, and third conductors are formed in a first plane as substantially flat strips on said body portion;

said third conductor includes first and second plate portions defining said gap therebetween; and said body portion includes a tab portion having first and second faces located in respective second and third parallel planes, said second and third planes being substantially perpendicular to said first plane and having a separation therebetween substantially equal to said gap, said first and second plate portions of said third conductor being formed on respective ones of said second and third planes.

2. The apparatus recited in claim 1 wherein said body portion is of plastic material and said conductors are formed of conductive metal plated upon said plastic material.

3. The apparatus recited in claim 2 wherein said body portion includes a first hole arrangement having conductive metal plated therethrough for forming said output coupling means.

4. The apparatus recited in claim 1 wherein said gap forms a spark gap.

* * * * *